United States Patent
Martinez

(10) Patent No.: US 6,624,354 B1
(45) Date of Patent: Sep. 23, 2003

(54) VEHICLE ELECTRICAL JUNCTION BOX

(75) Inventor: Ivan V. Martinez, Plymouth, MI (US)

(73) Assignee: Sews-DTC, Inc., Dearborn, MI (US)

( * ) Notice: Subject to any disclaimer, the term of this patent is extended or adjusted under 35 U.S.C. 154(b) by 0 days.

(21) Appl. No.: 10/158,324

(22) Filed: May 30, 2002

(51) Int. Cl.$^7$ ............................................... H05K 5/00
(52) U.S. Cl. ..................... 174/50; 174/50; 174/68.2; 174/50.5; 174/71 B; 174/65; 361/637; 361/611; 220/3.2; 220/2.1; 220/4.07; 337/34; 337/112; 337/121; 337/191
(58) Field of Search ................... 174/50, 68.2, 65, 174/50.5, 71 B; 337/121, 34, 112, 191; 220/3.2, 2.1, 4.07; 361/637, 611

(56) References Cited

U.S. PATENT DOCUMENTS

| | | | | |
|---|---|---|---|---|
| 5,162,616 A | * | 11/1992 | Swaffield et al. | 174/70 B |
| 5,763,827 A | * | 6/1998 | Sugiura | 174/49 |
| 5,902,138 A | * | 5/1999 | Murakami | 439/76.2 |
| 5,995,380 A | * | 11/1999 | Maue et al. | 174/254 |
| 6,043,431 A | | 3/2000 | Kato | 174/54 |

FOREIGN PATENT DOCUMENTS

| | | | | |
|---|---|---|---|---|
| JP | 09-312919 | * | 12/1997 | 174/50 |
| JP | 11-346419 | * | 12/1999 | 174/50 |

\* cited by examiner

Primary Examiner—Dean A. Reichard
Assistant Examiner—Anton Harris
(74) Attorney, Agent, or Firm—Harness, Dickey & Pierce, P.L.C.

(57) ABSTRACT

The junction box according to the invention includes a housing defined by a lower case and an upper case. A busbar substrate disposed within the housing includes a plurality of busbar substrates. The pier assembly is disposed on at least one of the lower case and one of the plurality of busbar substrates. The pier assembly either accommodates another of the plurality of busbar substrates or supports another of the plurality of busbar substrates. In one embodiment, the pier assembly is disposed on the lower case. In another embodiment, the pier assembly is disposed on one of the busbar substrates. In yet another embodiment, the pier assembly is disposed on the upper case. A method for assembling the junction box according to the invention includes providing a pier assembly for positioning a busbar substrate assembly and disposing a busbar substrate of the busbar substrate assembly in the lower case. The busbar substrate either receives the pier assembly therethrough or is supported on the pier assembly.

15 Claims, 6 Drawing Sheets

VEHICLE ELECTRICAL JUNCTION BOX

FIELD OF THE INVENTION

The present invention relates to a junction box and a method of assembly thereof and, more particularly, a junction box intended for use in automobiles.

DISCUSSION OF THE INVENTION

Junction boxes are typically used in automobiles to connect electrical components. Often, they include a busbar substrate assembly housed within a casing, which typically includes an upper case and a lower case sealed by a gasket. The casing may have two or more connectors, which are used to form the electrical connection between electrical components. The busbar substrate assembly may include multiple busbar substrates, each including an insulating substrate and a busbar to provide the circuitry required to make an electrical connection between components.

Depending on the application, each busbar substrate provided within a junction box may not be utilized. That is, as junction boxes are made uniform across a vehicle platform or multiple platforms in order to save manufacturing costs, the junction box may include several busbar substrates but not utilize each busbar substrate for a given application depending upon the required circuitry. Eliminating a busbar substrate that is not required for a particular application to save manufacturing costs is not practically feasible because the spacing within the junction box cannot be maintained when eliminating a busbar substrate layer. If spacing is not maintained, excessive noise or damage may result from loosely fit busbar substrates.

In order to eliminate the noise and/or component damage that might result from loosely fit busbar substrates, and allowing an unnecessary busbar substrate to be removed to save manufacturing costs for a particular application, the junction box and method for assembly described in detail herein is provided.

Generally, the junction box according to the invention includes a housing for a busbar substrate assembly including a plurality of busbar substrates. The lower case includes spacing and positioning piers for alternatively positioning one of the plurality of busbar substrates or maintaining the spacing of another busbar substrate. More specifically, the junction box includes a housing defined by a lower case and an upper case, the busbar substrate assembly including a plurality of busbar substrates, each including an insulating substrate and a busbar, a pier assembly including one or more piers for positioning one of the busbar substrates or maintaining the spacing of the remaining busbar substrates, wherein the pier assembly is formed on the housing. In one version of the invention, the pier assembly is formed on the lower case. In a variation of the invention, the pier assembly includes a single pier. In another variation, the pier assembly includes multiple piers.

A method for assembling a junction box includes providing a housing having an upper case and a lower case, providing a pier assembly on the housing, providing a busbar substrate assembly including one or more busbar substrates, disposing a busbar substrate in the lower case, and maintaining a spacing within the housing by positioning the busbar substrate such that the pier assembly is received therethrough or positioning the busbar substrate on the pier assembly.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
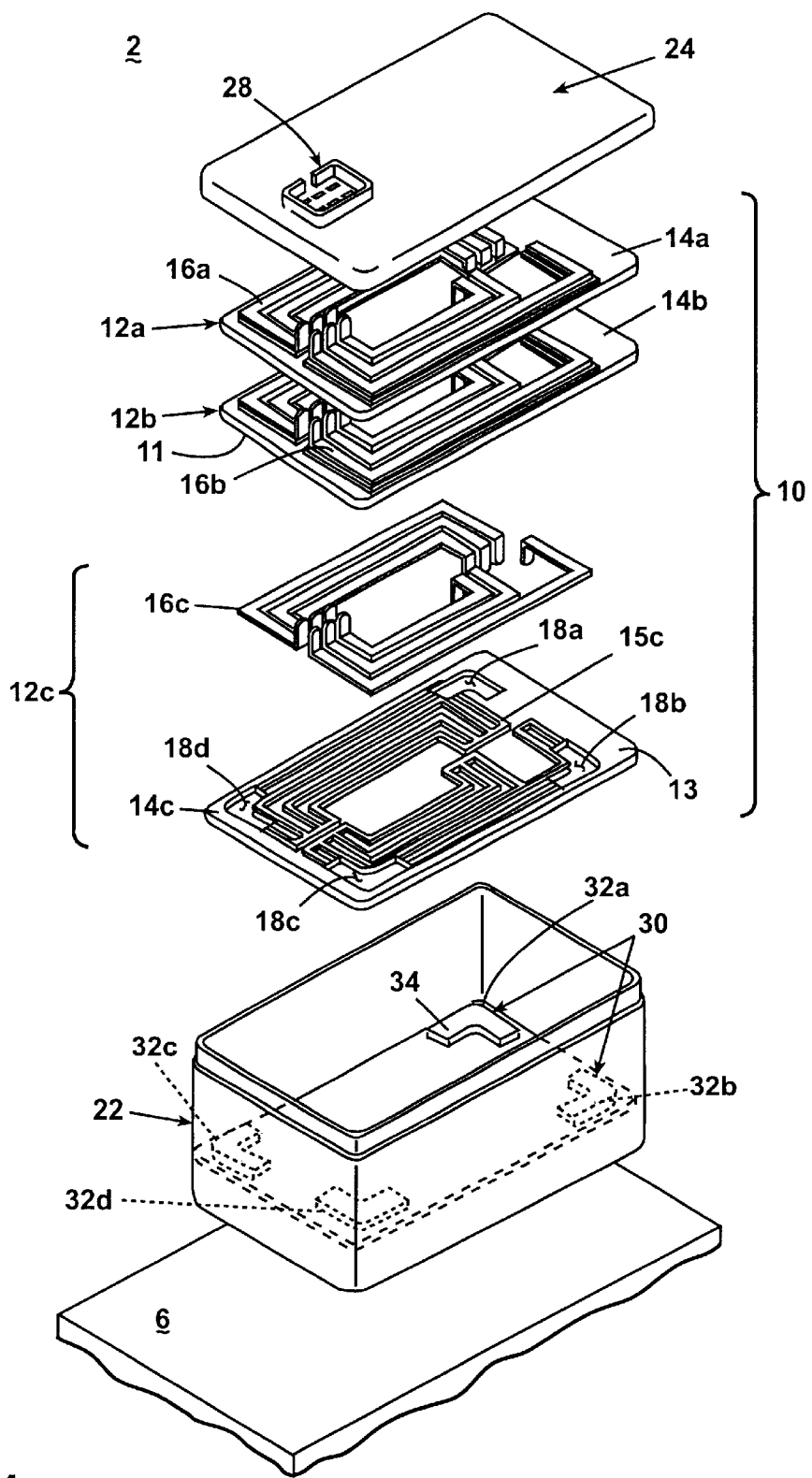
FIG. 1 illustrates an exploded perspective view of the junction box according to the invention.

The following description of the preferred embodiment(s) is merely exemplary in nature and is in no way intended to limit the invention, its application, or uses.

Referring to FIGS. 1–5, a junction box 2 includes a busbar substrate assembly 10, a housing 20, and a pier assembly 30. The junction box 2 may be mounted to a mounting surface 6. The busbar substrate assembly 10 includes one or more busbar substrates 12, each including an insulating substrate 14 and a busbar 16. The housing 20 includes a lower case 22 and an upper case 24 sealed when assembled by a gasket (not shown) at the junction of the lower and upper cases 22, 24 to prevent water and/or debris from entering the junction box 2. The pier assembly 30 includes one or more piers 32. As shown, the housing 20 includes a male connector cavity 28 on an upper surface of the upper case 24 and contains male tab openings to receive tabs of busbar 16 inserted therethrough.

As shown, the busbar substrate assembly 10 includes busbar substrates 12a, 12b, 12c. More or fewer busbar substrates 12 may be employed, depending on the particular application. Each busbar substrate 12a, 12b, 12c includes a corresponding insulating substrate 14a, 14b, 14c and a busbar 16a, 16b, 16c. Further, at least one of the busbar substrates 12 includes one or more positioning apertures 18. As shown, busbar substrate 12c includes positioning apertures 18a, 18b, 18c, 18d. Further, each insulating substrate 14 includes insulating ribs 15 formed therein at positions corresponding to the busbar 16 so as to insulate the busbar 16 and maintain the position of the busbar 16 on the insulating substrate 14. As shown in FIG. 1, insulating substrate 14c includes ribs 15c.

The pier assembly 30 includes one or more piers 32 to space and/or position the busbar substrate assembly 10 in the housing 20. Piers 32a, 32b, 32c, 32d are exemplary in shape and are complimentary to positioning apertures 18a, 18b, 18c, 18d in busbar substrate 12c. The piers 32 can be of various shapes and configurations, with the shapes and configurations shown in FIG. 1 being merely a non-limiting example. For example, with reference to FIGS. 4 and 5, other pier assembly 30 configurations are shown, including a single pier 32' and a pair of piers 32". Again, the various pier shapes and configurations are exemplary and not limiting.

Each pier 32 is shaped to mate with a busbar substrate 12, such as busbar substrate 12c, wherein the positioning apertures 18 receive the piers 32 to position the busbar substrate 12c on the lower case 22. The height of the piers 32 is similar to the height of the busbar substrate 12c, whereby a top surface 34 of each pier 32 is generally planar with a top surface 13 of the busbar substrate 12c. By removing the busbar substrate 12c in the manufacture of the junction box 2 for a particular vehicle application, the top surface 34 of each pier 32 supports the remaining busbar substrate assembly 10 at its proper position within the housing 20 through engagement with a bottom surface 11 of the busbar substrate 12b. Thus, should the circuitry provided on busbar substrate 12c not be required, the busbar substrate 12c can be eliminated when manufacturing the junction box 2 without altering the positioning of the remaining busbar substrates 12a, 12b of the busbar substrate assembly 10. In this manner, noise and/or damage from a loosely fit busbar substrate 12 is eliminated and the added expense of including an otherwise unnecessary busbar substrate 12c to maintain spacing is avoided.

Figure 2:
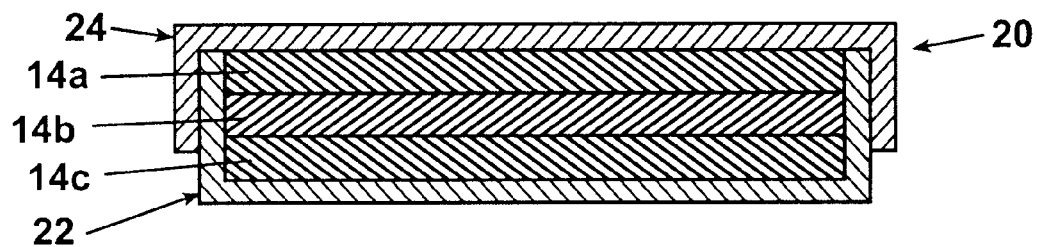
FIG. 2 is a cross-section of an assembled junction box according to a configuration of the invention.
Figure 3:
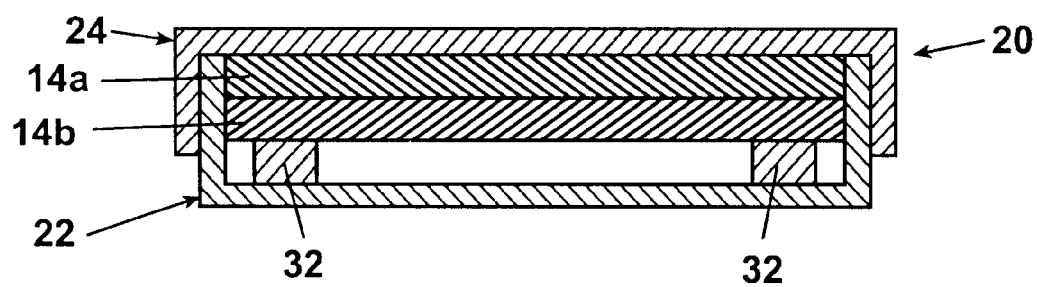
FIG. 3 is a cross-section of an assembled junction box according to another configuration of the invention.
Figure 4:
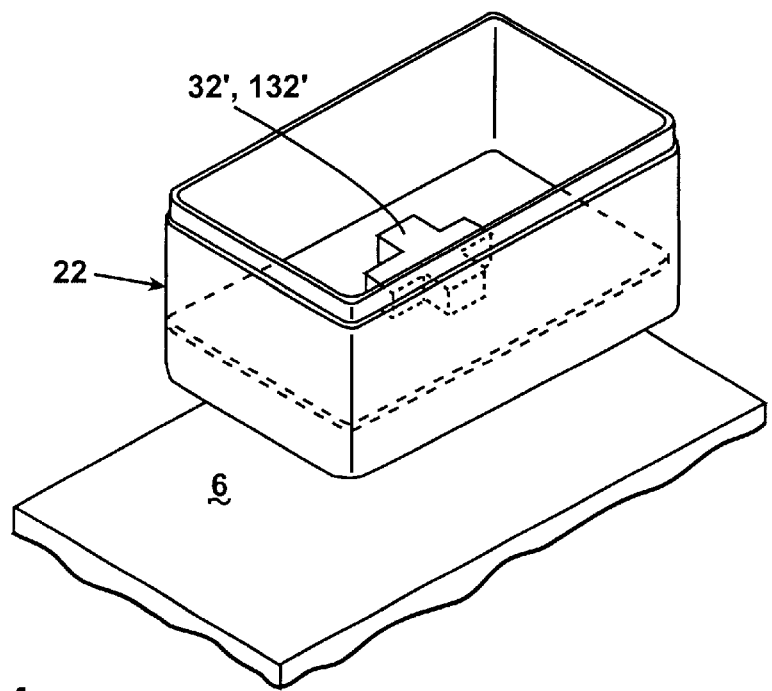
FIG. 4 illustrates a perspective view of an alternative pier assembly configuration according to the invention.

To manufacture the junction box 2, the lower case 22 is grasped by a chuck (not shown in the drawings) of an automated device and positioned relative to a positioning tool. If appropriate for a particular application, the busbar substrate 12c is grasped using the chuck of the automated device and positioning apertures 18a, 18b, 18c, 18d of busbar substrate 12c are aligned with piers 32a, 32b, 32c, 32d, respectively, and positioned on lower case 22. Because the piers 32a, 32b, 32c are inserted through positioning apertures 18a, 18b, 18c, 18d, the busbar substrate 12c is reliably assembled and properly located on lower case 22, as best shown in FIG. 2.

Figure 5:
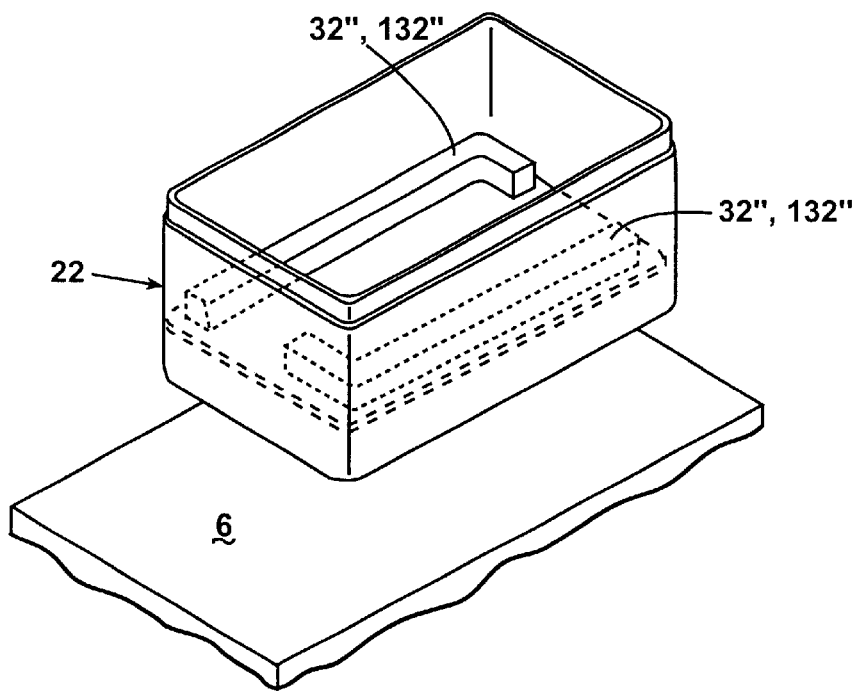
FIG. 5 illustrates a perspective view of yet another pier assembly configuration according to the invention.
Figure 6:
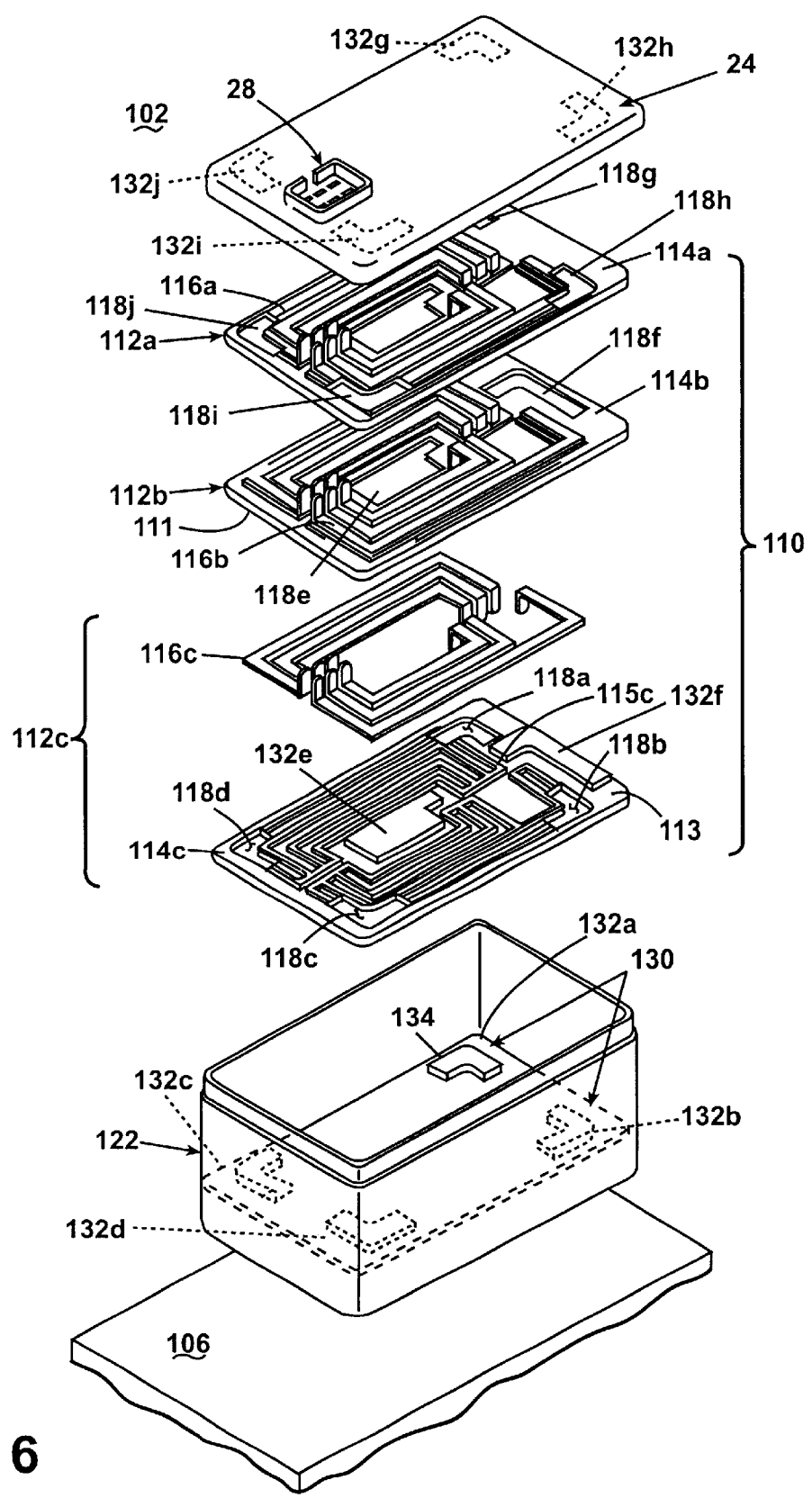
FIG. 6 illustrates an exploded perspective view of the junction box according to a variation of the invention.

If the busbar substrate 12c is not required for a particular application, the busbar substrate 12b is grasped using the chuck of the automated device and aligned with and mounted in lower case 22 on the pier assembly 30 such that the bottom surface 11 of busbar substrate 12b engages the top surfaces 34 of the piers 32a, 32b, 32c. Because the pier assembly 30 supports the busbar substrate 12b, busbar substrate 12b is reliably assembled and properly positioned in the lower case 22, even in the absence of busbar substrate 12c, as best shown in FIG. 5.

Depending on the application, it may be appropriate to include the busbar substrate 12a, which is grasped using the chuck of the automated device and positioned on busbar substrate 12b. Certain applications, however, will not require that the junction box 2 include more than a single busbar substrate 12, which in this example would be busbar substrate 12b. To enclose the housing 20, the upper case 24 is grasped with the chuck of the automated device and positioned on the lower case 22 to enclose the busbar substrate assembly 10 within the housing 20. A gasket (not shown) may be included prior to seating the upper case 24 on the lower case 22 by grasping the gasket with the chuck of the automated device and positioning the gasket about the perimeter of the opening for the lower case 22, whereby the housing is sealed.

As described, regardless of whether a particular busbar substrate 12, i.e., busbar substrate 12c in the above description, is necessary for a particular vehicle application, the busbar substrate assembly 10 is nonetheless properly positioned within the housing 20 because the pier assembly 30 alternatively accommodates the busbar substrate 12c or positions the busbar substrate 12b. Further, additional busbar substrates may be employed in layers on busbar substrate 12b, such as busbar substrate 12a as described above. Although the above description has been described with reference to two or three busbar substrates 12, it will be appreciated by those skilled in the art that fewer than two and more than three busbar substrates can be included in the junction box 2 in accordance with the present invention.

Referring to FIGS. 6–9, a variation of the invention is shown as a junction box 102 including a busbar substrate assembly 110, a housing 120, and a pier assembly 130. The junction box 102 may be mounted to a mounting surface 106. A busbar substrate assembly 112 includes one or more busbar substrate 112, each including an insulating substrate 114 and a busbar 116. The housing 120 includes a lower case 122 and an upper case 124 sealed when assembled by a gasket (not shown) at the junction of the upper and lower cases 122, 124 to prevent water and/or debris from entering the junction box 102. The pier assembly 130 includes one or more piers 132. As shown, the housing 120 includes a male connector cavity 128 on an upper surface of the upper case 124 and contains male tab openings to receive tabs of busbar 116 inserted therethrough.

As shown, the busbar substrate assembly 110 includes busbar substrates 112a, 112b, 112c. More or fewer busbar substrates 112 may be employed depending on the particular application. Each busbar substrate 112a, 112b, 112c includes a corresponding insulating substrate 114a, 114b, 114c and a busbar 116a, 116b, 116c. Further, each of the busbar substrates 112a and 112c includes one or more positioning apertures 118. As shown, busbar substrate 112c includes positioning apertures 118a, 118b, 118c, 118d ; busbar substrate 112a includes positioning apertures 118g, 118h, 118i, 118j ; and busbar substrate 112b includes positioning apertures 118e, 118f. Further, each insulating substrate 114 includes insulating ribs 115 formed therein at positions corresponding to the busbar 116 so as to insulate the busbar 116 to maintain the position of the busbar 116 on the insulating substrate 114. As shown in FIG. 1, insulating substrate 114c includes ribs 115c.

The pier assembly 130 includes one or more piers 132 to space and/or position the busbar substrate 110 and the housing 120. Piers 132a, 132b, 132c, 132d extend upwardly from the bottom surface of the lower case 122, and are exemplary in shape and complimentary to positioning apertures 118a, 118b, 118c, 118d in busbar substrate 112c. Further, piers 132e, 132f extend upwardly from a top surface 113 of busbar substrate 112c, and are exemplary in shape and complimentary to positioning apertures 118e, 118f in busbar substrate 112b. Further, piers 132g, 132h, 132i, 132j extend downwardly from an interior, bottom surface of cover 124, and are exemplary in shape and complimentary to positioning apertures 118g, 118h, 118i, 118j in busbar substrate 112a.

Piers 132 can be of various shapes and configurations, with the shapes and configurations shown in FIG. 1b merely a non-limiting example. For example, with reference to FIGS. 4 and 5, as discussed previously, other pier assembly 130 configurations are shown, including a single pier 132' and a pair of piers 132". Further, while the pier assembly 130 configurations are shown with respect to lower case 122, such pier assembly configurations are applicable to busbar substrates 112 as well. Again, the various pier shapes and configurations are exemplary and not limiting.

Each pier 132 is shaped to mate with a busbar substrate 112, where the positioning apertures 118 receive the piers 132 to position a busbar substrate 112 relative another busbar substrate 112 or lower case 122. The height of the piers 132 is similar to the height of the busbar substrate 112 having the positioning apertures 118, whereby a top surface 134 of each pier 132 is generally planar with a top surface 113 of a busbar substrate 112. By removing a busbar substrate 112 in the manufacture of the junction box 102 for a particular vehicle application, the top surface 134 of each pier 132 supports or maintains another busbar substrate assembly 110 at its proper position within the housing 120 through engagement with bottom surface 111 or top surface 113 of a particular busbar substrate 112. Thus, should the circuitry provided on a particular busbar substrate 112 not be required, such a busbar substrate 112 can be eliminated when manufacturing the junction box 102 without alternative positioning of the remaining busbar substrate 112. In this manner, noise and/or damage from a loosely-fit busbar substrate is eliminated and the added expense of including an otherwise unnecessary busbar substrate 112 to maintain spacing is avoided.

Figure 9:
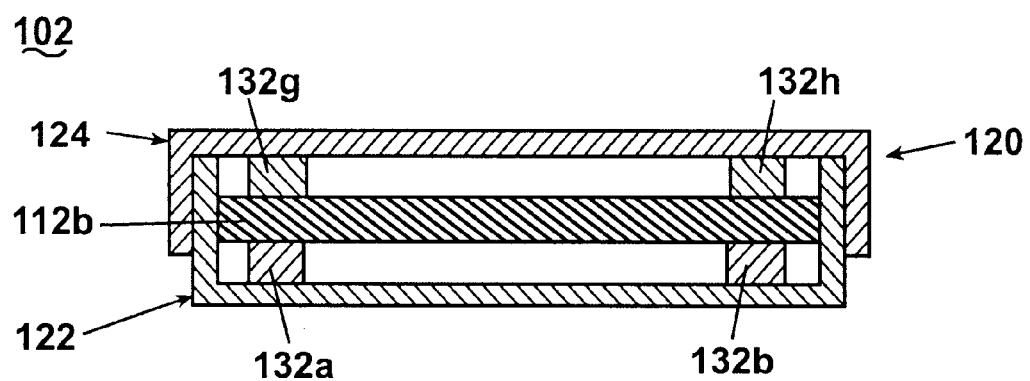
FIG. 9 is a cross-section of an assembled junction box according to yet another configuration of the variation of the invention shown in FIG. 6.

For the junction box 102, any of the busbar substrates 112a, 112b, 112c can be removed while maintaining proper spacing in the junction box 102. Further, it is possible to remove busbar substrate 112a and busbar substrate 112c and still maintain busbar substrate 112b in its proper position within junction box 102, as best shown in FIG. 9. With a different configuration of piers and apertures, it is possible to remove busbar substrate 112a and busbar substrate 112b, and maintain the proper position of busbar substrate 112c in the junction box 102. Similarly, another arrangement of piers and apertures allows removal of busbar substrates 112b and 112c and still maintains the proper position and spacing of busbar substrate 112a. In sum, it is possible to modify the design to accommodate various configurations allowing versatility as required (e.g., adding downwardly extending piers from the bottom surface of busbar substrate 112a to align with and abut the upwardly extending piers from the bottom surface of the lower case 122). In designing such configurations, the alignment and misalignment of various piers and apertures allows the various configurations.

Figure 7:
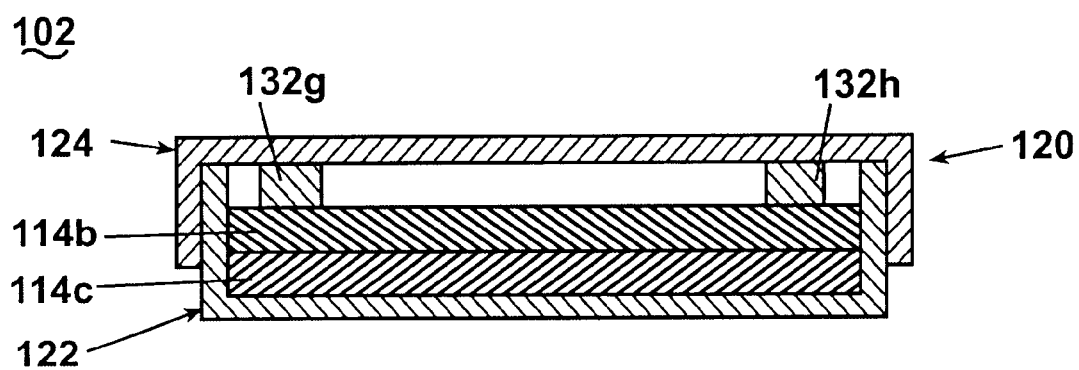
FIG. 7 is a cross-section of an assembled junction box according to a configuration of the variation of the invention shown in FIG. 6.
Figure 8:
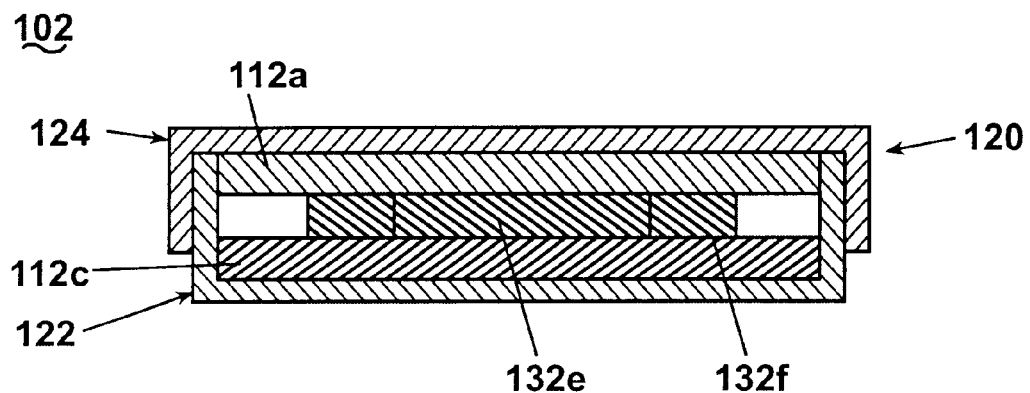
FIG. 8 is a cross-section of an assembled junction box according to another configuration of the variation of the invention shown in FIG. 6.

The junction box 102 is manufactured in a manner similar to junction box 2, wherein the lower case 22 is grasped by a chuck print (not shown in the drawings) of an automated device in position relative to a positioning tool. If appropriate for a particular application, the busbar substrate 112c is grasped using the chuck of the automated device and positioning aperture 118a, 118b, 118c, 118d of busbar substrate 112c are aligned with piers 132a, 132b, 132c, 132d, respectively, and positioned on lower case 122. Because the piers 132a, 132b, 132c are inserted through positioning apertures 118a, 118b, 118c, 118d, the busbar substrate 112c is reliably assembled and properly located on lower case 122, as best shown in FIGS. 7 and 8.

Whether or not the busbar substrate 112c is required for a particular application (compare FIGS. 7 and 9), the busbar substrate 112b may be grasped and positioned using the chuck as described previously. If appropriate for a particular application, the busbar substrate 112b is grasped using the chuck of the automated device and piers 132e, 132f of busbar substrate 112c, if present, are aligned with positioning apertures 118e, 118f of busbar substrate 112b ; otherwise, piers 132a, 132b, 132c, 132d of the lower surface of lower case 122 abut the bottom surface 111 of busbar substrate 112b. Because the piers. 132a, 132b, 132c, 132d are either positioned through positioning apertures 118a, 118b, 118c, 118d or support the busbar substrate 112b via abutment with its bottom surface 113, the busbar substrate 112b is reliably assembled and properly located on lower case 122. As shown in FIG.7, busbar substrate 112b and busbar substrate 112c are both positioned within the housing 120.

Whether or not the busbar substrate 112b is required for a particular application, the busbar substrate 112a may be grasped using the chuck of the automated device and aligned with and mounted in lower case 122. If appropriate for a particular application, the busbar substrate 112a is grasped using the chuck of the automated device and piers 132g, 132h, 132i, 132j are aligned with positioning apertures 118g, 118h, 118i, 118j of busbar substrate 112a. If busbar substrate 112a is not required for a particular application, the piers 132g, 132h abut the top surface 111 of busbar substrate 112b. Because the piers 132g, 132h, 132i, 132j are either positioned through positioning apertures 118g, 118h, 118i, 118j or are supported on top surface 111 of busbar substrate 112b, the busbar substrate 112a is reliably assembled and properly located in lower case 122.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A junction box comprising:
   a housing defined by a lower case and an upper case;
   a pier assembly disposed on said lower case and extending toward said upper case; and
   a busbar substrate assembly including a busbar substrate of either a first configuration or a second configuration, wherein said busbar substrate is supported on said pier assembly for said first configuration and is positioned abutting said lower case for said second configurations, said pier assembly operable to support said busbar substrate of said first configuration and operable to pass through openings in said busbar substrate of said second configuration.

2. The junction box of claim 1, wherein said busbar substrate of said first configuration includes a positioning aperture adapted to receive said pier assembly, wherein said busbar substrate abuts said lower case and receives said pier assembly.

3. The junction box of claim 1, wherein said busbar substrate of said second configuration includes a lower surface abutting a top surface of said pier assembly to maintain said busbar substrate a predetermined distance from said lower case.

4. The junction box of claim 1, wherein said busbar substrate assembly includes a plurality of busbar substrates, at least one of which either accommodates said pier assembly or is supported by said pier assembly.

5. The junction box of claim 1, wherein said at least one busbar substrate includes a second pier assembly.

6. The junction box of claim 5, wherein said busbar substrate assembly includes a plurality of busbar substrates, at least one of which either accommodates said pier assembly or is supported by said pier assembly, at least another of which either accommodates said second pier assembly or is supported by said second pier assembly.

7. A junction box comprising:
   a housing defined by a lower case and an upper case;
   a busbar substrate assembly including a plurality of busbar substrates; and
   a pier assembly disposed on at least one of said lower case and one of said plurality of busbar substrates, said pier assembly operable to pass through openings in another of said plurality of busbar substrates and operable to support another of said plurality of busbar substrates.

8. The junction box of claim 7, wherein said another of said plurality of busbar substrates includes a positioning aperture adapted to receive said pier assembly, wherein said another of said plurality of busbar substrates abuts said lower case and receives said pier assembly.

9. The junction box of claim 7, wherein said another of said plurality of busbar substrates includes a lower surface abutting a top surface of said pier assembly to maintain said another of said plurality of busbar substrates in a predetermined position.

10. The junction box of claim 7, wherein said one of said plurality of busbar substrates includes a second pier assembly.

11. The junction box of claim 10, wherein said one of said plurality of busbar substrates either accommodates said pier assembly or is supported by said pier assembly, said another of said plurality of busbar substrates either accommodates said second pier assembly or is supported by said second pier assembly.

12. A method for assembling a junction box including a housing defined by a lower case and an upper case, said steps comprising:
   disposing a busbar substrate of a busbar substrate assembly in the lower case;
   supporting said busbar substrate of a first configuration; and
   receiving a pier assembly through openings in said busbar substrate of a second configuration.

13. The method of claim 12, further comprising the step of disposing another busbar substrate of said busbar substrate assembly in the lower case.

14. The method of claim 12, further comprising the step of providing a second pier assembly on said busbar substrate, and disposing a second busbar substrate of said busbar substrate assembly in the lower case, said second busbar substrate either receiving said second pier assembly therethrough or being supported on said second pier assembly.

15. The method of claim 12, further comprising the step of providing a second pier assembly on said upper case for positioning a busbar substrate assembly, and disposing a second busbar substrate of said busbar substrate assembly in said lower case, said second busbar substrate either receiving said second pier assembly therethrough or being supported on said second pier assembly.

* * * * *

UNITED STATES PATENT AND TRADEMARK OFFICE
CERTIFICATE OF CORRECTION

PATENT NO. : 6,624,354 B1
DATED : September 23, 2003
INVENTOR(S) : Ivan V. Martinez It is certified that error appears in the above-identified patent and that said Letters Patent is hereby corrected as shown below:

<u>Title page,</u>
Item [73], Assignee, "Sews-DTC, Inc." should be -- SEWS-DTC, Inc. --

<u>Column 6,</u>
Line 44, "configurations" should be -- configuration --

Signed and Sealed this

Seventeenth Day of February, 2004

JON W. DUDAS
*Acting Director of the United States Patent and Trademark Office*